(12) United States Patent
Phillips et al.

(10) Patent No.: US 8,856,856 B2
(45) Date of Patent: Oct. 7, 2014

(54) SET-TOP BOX HAVING MEDIA GATEWAY, SERVER AND STORAGE UNITS

(75) Inventors: Sheldon George Phillips, Thousand Oaks, CA (US); Ben Crosby, Murphy, TX (US)

(73) Assignee: Thomson Licensing, Issy les Moulineaux (FR)

(*) Notice: Subject to any disclaimer, the term of this patent is extended or adjusted under 35 U.S.C. 154(b) by 0 days.

(21) Appl. No.: 13/976,206

(22) PCT Filed: Jan. 3, 2012

(86) PCT No.: PCT/US2012/020011
§ 371 (c)(1),
(2), (4) Date: Jun. 26, 2013

(87) PCT Pub. No.: WO2012/094272
PCT Pub. Date: Jul. 12, 2012

(65) Prior Publication Data
US 2013/0268993 A1  Oct. 10, 2013

Related U.S. Application Data

(60) Provisional application No. 61/460,595, filed on Jan. 5, 2011.

(51) Int. Cl.
*H04N 7/173* (2011.01)
*H04N 5/76* (2006.01)
*G05B 19/00* (2006.01)

(52) U.S. Cl.
USPC .............................. 725/134; 386/291; 340/5.2

(58) Field of Classification Search
CPC ............................. H04N 5/44513; H04N 21/00
USPC .......................................................... 725/134
See application file for complete search history.

(56) References Cited

U.S. PATENT DOCUMENTS 5,471,099 A  11/1995  Larabell et al.
6,076,142 A   6/2000  Corrington et al.
(Continued)

FOREIGN PATENT DOCUMENTS

WO  WO2009057124  5/2009
WO  WO2011093951  8/2011
WO  WO2011159566  12/2011

OTHER PUBLICATIONS

F.Fossati:Modular_Design_For_A_Set—Top_ElettronicaOggi_ Feb. 28, 1997 Orginal and Abstract.
(Continued)

*Primary Examiner* — Pankaj Kumar
*Assistant Examiner* — Tariq Gbond
(74) *Attorney, Agent, or Firm* — Robert D. Shedd; Richard LaPeruta

(57) ABSTRACT

A set top box is provided that has a low profile modular configuration that enables the control unit and storage unit to function independently from each other or as a combined unit. The set top box includes a control unit, a storage unit, and a connector positioned there between. The storage unit includes a housing and a plurality of storage bays for receiving storage modules having two parallel broad sides. The connector is positioned between the control unit and the storage unit and secures the control and storage units together. The connector has a vertical peripheral cross section substantially the same as a vertical peripheral cross section of the control unit and the storage unit.

20 Claims, 23 Drawing Sheets

(56) References Cited

U.S. PATENT DOCUMENTS

| | | | |
|---|---|---|---|
| 6,144,553 A * | 11/2000 | Hileman et al. | ......... 361/679.52 |
| 6,431,718 B1 | 8/2002 | Gamble et al. | |
| 7,408,433 B1 | 8/2008 | Irwin | |
| 2008/0152305 A1* | 6/2008 | Ziegler | ........................... 386/94 |
| 2010/0026912 A1 | 2/2010 | Ho | |
| 2010/0289615 A1* | 11/2010 | Adams | ........................... 340/5.2 |
| 2010/0328911 A1 | 12/2010 | Tang | |
| 2012/0109369 A1* | 5/2012 | Paluga | ........................ 700/236 |

OTHER PUBLICATIONS

Search Report Dated Oct. 12, 2012.

* cited by examiner

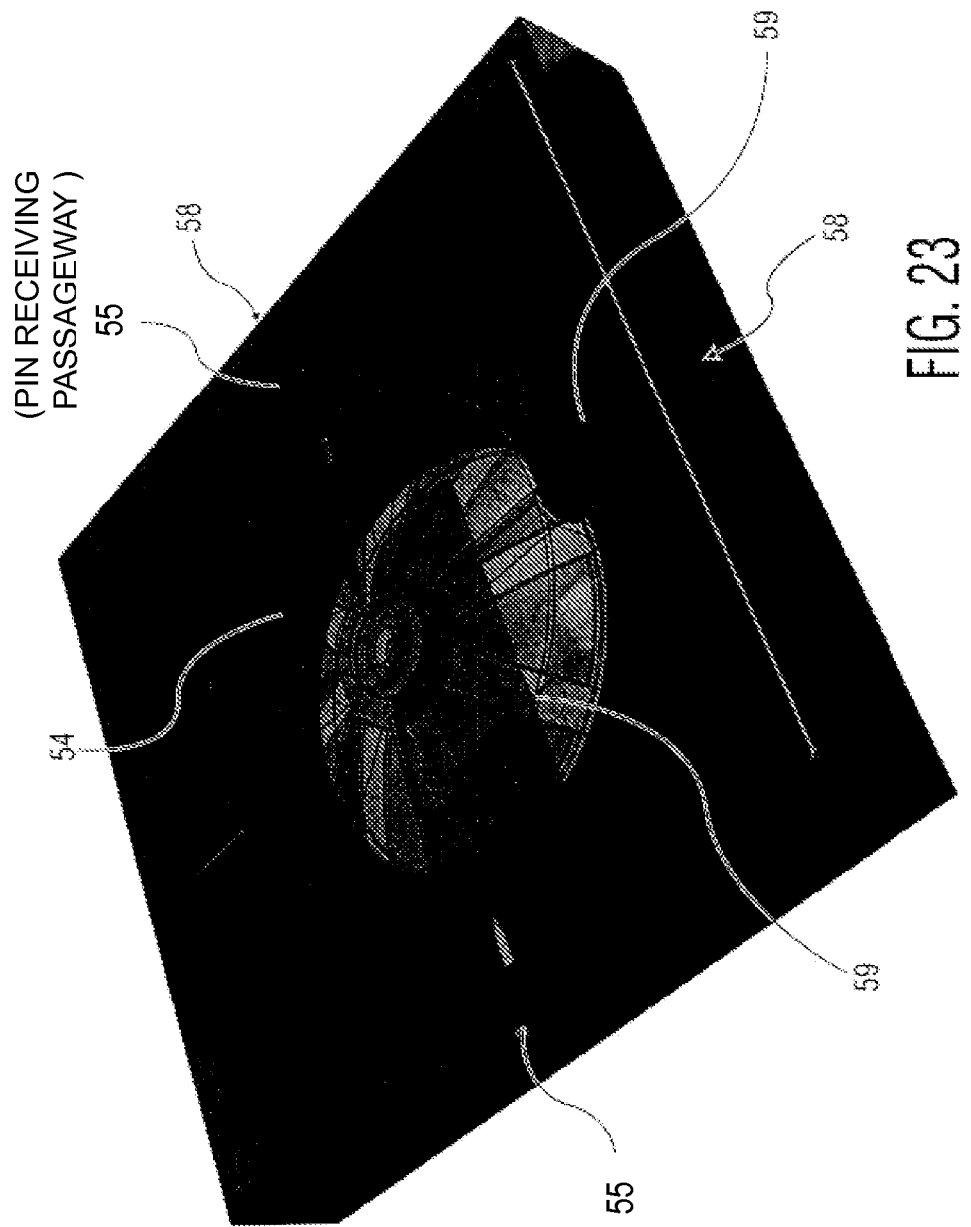

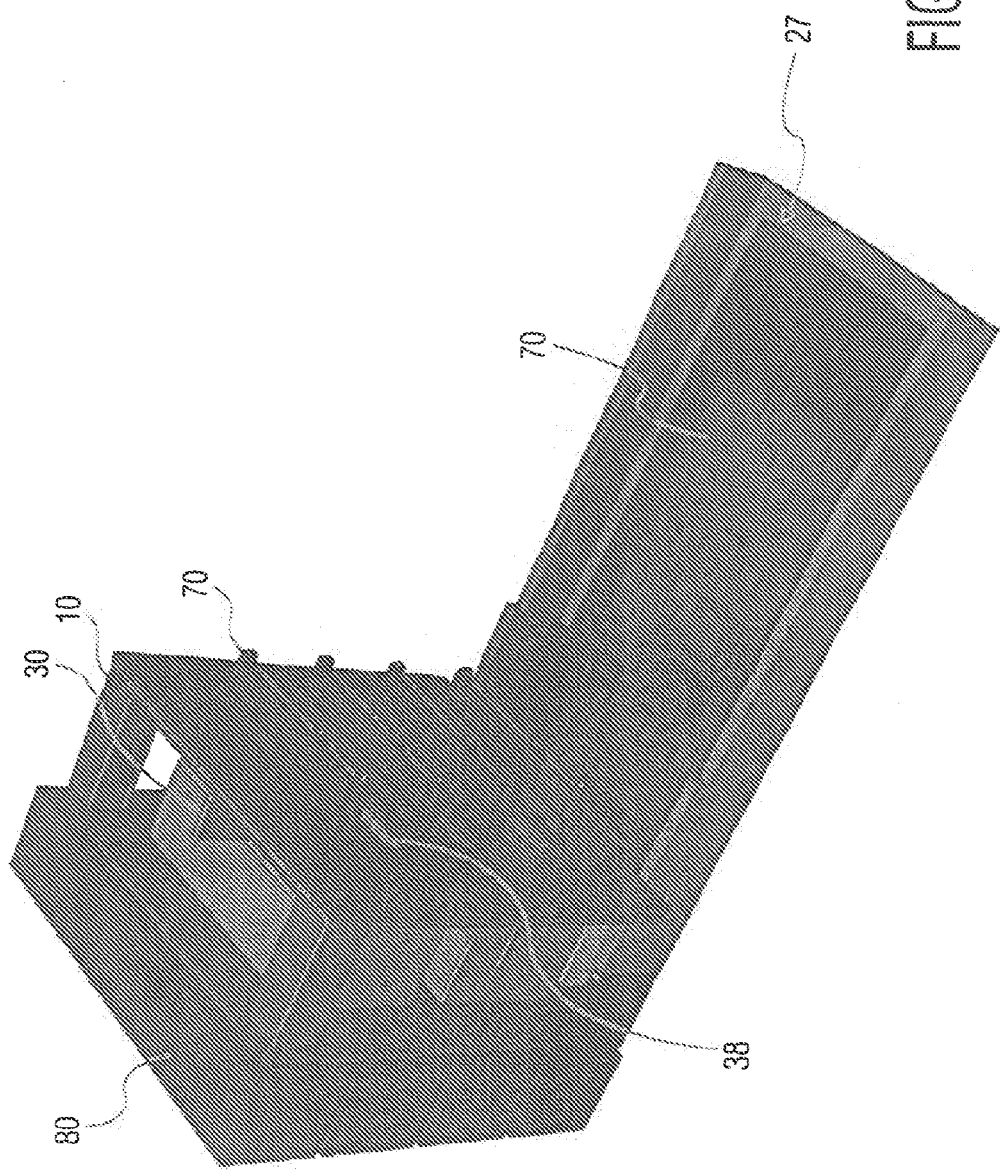

SET-TOP BOX HAVING MEDIA GATEWAY, SERVER AND STORAGE UNITS

CROSS-REFERENCE TO RELATED APPLICATIONS

This application is a National Stage Application and claims the benefit, under 35 U.S.C. §365 of International Application PCT/US2012/020011 filed Jan. 3, 2012 which was published in accordance with PCT Article 21(2) on Jul. 12, 2012 in English and which claims the benefit of U.S. Provisional Patent Application No. 61/460,595 filed Jan. 5, 2011.

FIELD OF THE INVENTION

The invention relates to a set top box and, in particular, to a set top box configured for media, gateway, and storage functions.

BACKGROUND

A cable or satellite receiver is generally known as a set top box. The common set top box (STB) is an information device that generally connects to a display device and an external source of signal (i.e. cable, broadband) and includes a tuner and circuitry to convert the signal into media content which displayable on the display device.

The digital video recorder (DVR), also referred to as a personal video recorder (PVR), was developed to record video in a digital format to a disk drive, USB flash drive, SD memory card or other local or networked mass storage device. Initially, the DVR was a separate unit with a separate power source. These DVRs are often connected to the set top box and display device through cables. However, the distinction between the set top box and storage devices such as the digital video recorder (DVR) has been blurred by the increasing deployment of set top boxes with hard discs, network or USB interfaces built-in. The STB has become a multimedia interactive tool. The STB converts and delivers media to the television, provides connectivity to the internet, and records and manipulates content delivered.

While the need has developed for a more compact STB, the amount of needed storage space and the number of ports/components has increased. As a result, a low profile set top box that is capable of media, gateway, and storage function is needed.

SUMMARY

Accordingly, the invention was devised in light of the problems described above, and an object of the invention, inter alia, is to provide a set top box having a low profile modular configuration that enables the control unit and storage unit function independently from each other or as a combined unit.

The set top box includes a control unit, a storage unit, and a connector positioned therebetween. The storage unit includes a housing and a plurality of storage bays for receiving storage modules having two parallel broad sides. The connector is secured to the control unit and the storage unit together and positioned there between. Also, the connector has a vertical peripheral cross section being substantially the same as a vertical peripheral cross section of the control unit and the storage unit.

In embodiments of the invention, an electronic system is provided that comprises: a set top box or control component; an electronic data storage component, the electronic data storage component having a plurality of slots each designed to receive and hold storage modules or hard drives, the storage modules or hard drives having two parallel broad sides; and a divider physically connected to the set top box component or control component and the electronic data storage, the divider having a vertical peripheral cross section that is substantially the same as vertical peripheral cross sections of the set top box component or control component and the electronic data storage. The electronic data storage component can be configured such that the broad sides of storage modules or hard drives are parallel to one another and have air gaps therebetween. The electronic data storage component can be configured such that cooling air is unidirectionally drawn into the electronic data storage component in a first direction between a broad side of a first storage module or hard drive and a first wall of the electronic data storage component and travels through an entire length of the first storage module or hard drive; wherein the electronic data storage component is further configured to have the air travel unidirectionally in a second direction opposite to the first direction between each adjacent pair of broad sides of the storage modules or hard drives; and wherein the air is finally exhausted from the electronic data storage component in the second direction. The electronic data storage component can have a plurality of vents at a first end, the first end wall being oppose a second end which is adjacent to the divider. The electronic data storage component can comprise a removal door at the first end that has a magnetic locking mechanism comprising: a plurality of elongated magnetic components surrounding a central region, the elongated magnetic components being in a common plane and each generally directed toward the central region; a plurality of shafts in the removal door which contain the elongated magnetic components and permit each magnet component to side therein; a plurality of locking apertures on at least two walls of the electronic data storage component that are each aligned with the shafts in the removal door such that when the elongated magnetic components are in a locked position, a portion of the elongated magnetic components slides into the locking apertures, thereby locking the door; and a centrally mounted rotating door locking handle having a centrally mount magnet assembly having a lock orientation and an unlock orientation, wherein the handle causes the elongated magnetic components to slide into the locking apertures when the handle is rotated to the lock orientation and the handle causes the elongated magnetic components to slide out of the locking apertures when the handle is rotated to the unlock orientation. The magnetic door assembly can be constructed to permit the appropriate cooling air flow. The electronic data storage component can comprise a light pipe for each of the slot, wherein the light pipes are designed and configure to emit light when a storage modules or hard drives is properly inserted therein, thereby signifying that the given storage module or hard drive is ready for use.

BRIEF DESCRIPTION OF THE DRAWINGS

The invention will be explained in detail with reference to embodiments, referring to the drawings, in which:

FIG. 23 is perspective view of the access door showing the pin receiving passageways for receiving the securing pins;

FIG. 26 is a perspective view showing circuitry of the storage unit according to the invention.

DETAILED DESCRIPTION OF THE EMBODIMENT(S)

The present disclosure is directed towards a number of inventive concepts for a set top box having a media gateway, a server and storage units, as discussed below and illustrated in the exemplary FIGS. 1-26.

It should be understood that the drawings are for purposes of illustrating the concepts of the disclosure and is not necessarily the only possible configuration for illustrating the disclosure.

The set top box 1 according to the invention includes modular components, including a control unit 10, a storage unit 20, and a connector 40 connecting the control unit 10 and storage unit 20. As will be discussed in detail below, the storage unit 20 is configured to hold, operate with, and provide cooling for a plurality of storage modules, which are connectable with the control unit through the connector 40. As a result, the exemplary set top box according to the invention has a smaller, low profile and modular configuration that enables the control unit 10 and storage unit 20 to function independently from each other or as a combined unit, with a space saving footprint.

With reference to FIGS. 1-11, an assembly of the control unit 10, connector, 40, and the storage unit 20 is shown.

Figure 1:
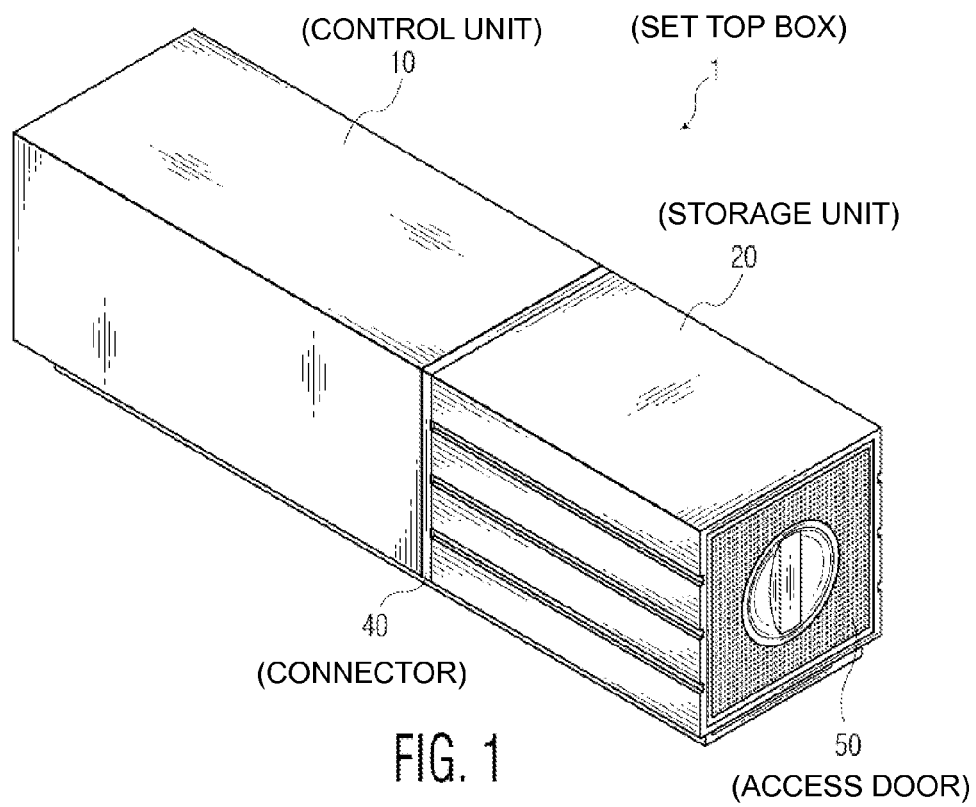
FIG. 1 is a perspective view of a set top box with a storage unit according to the invention.
Figure 2:
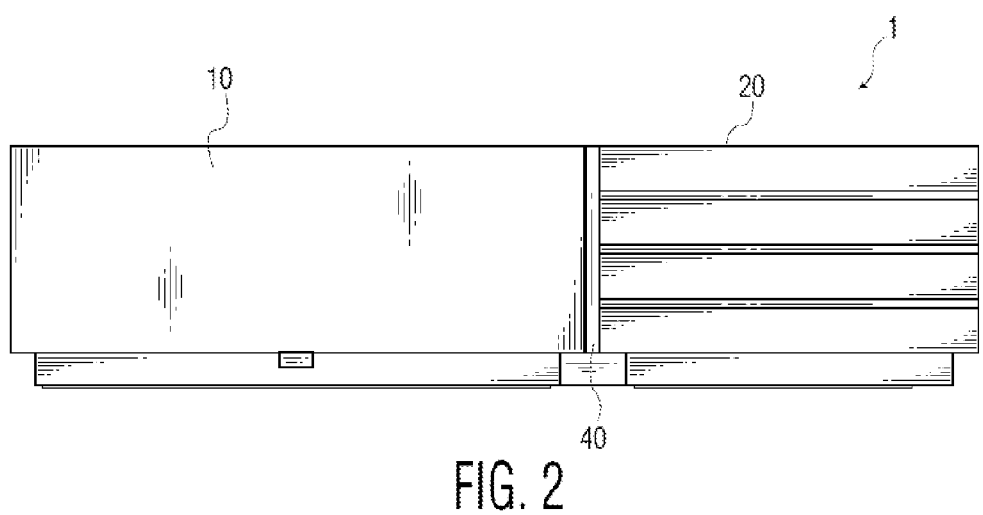
FIG. 2 is a left side view of the set top box with the storage unit according to the invention.
Figure 3:
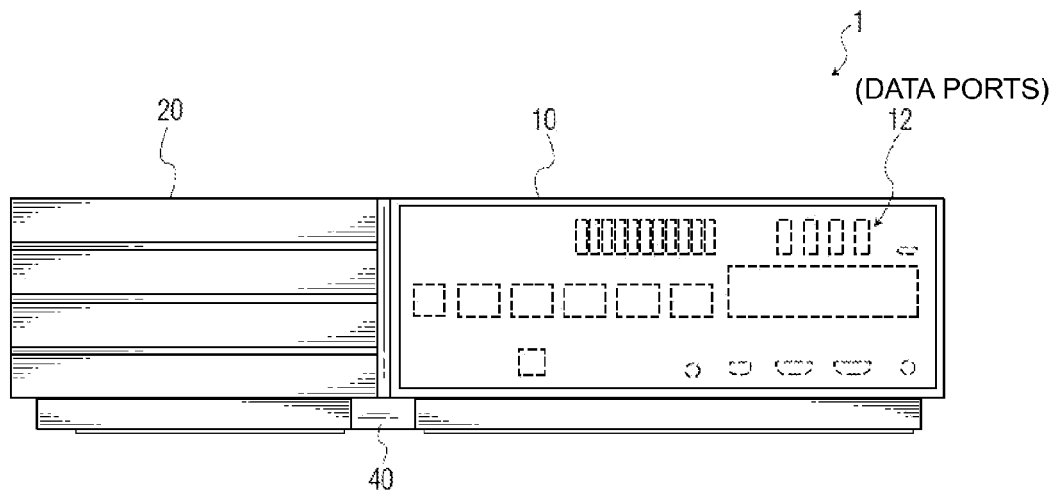
FIG. 3 is a right side view of the set top box with the storage unit according to the invention.
Figure 4:
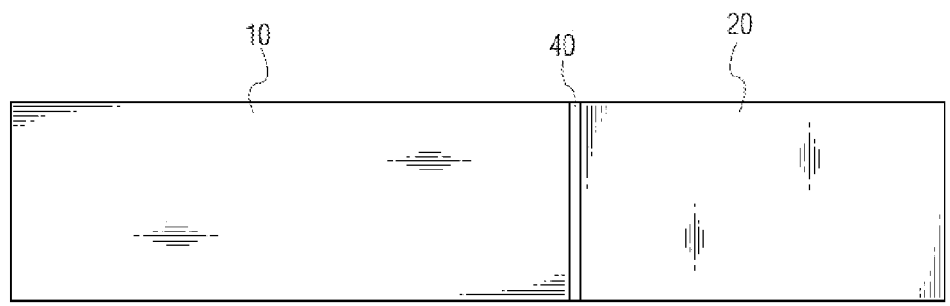
FIG. 4 is a top view of the set top box with the storage unit according to the invention.
Figure 5:
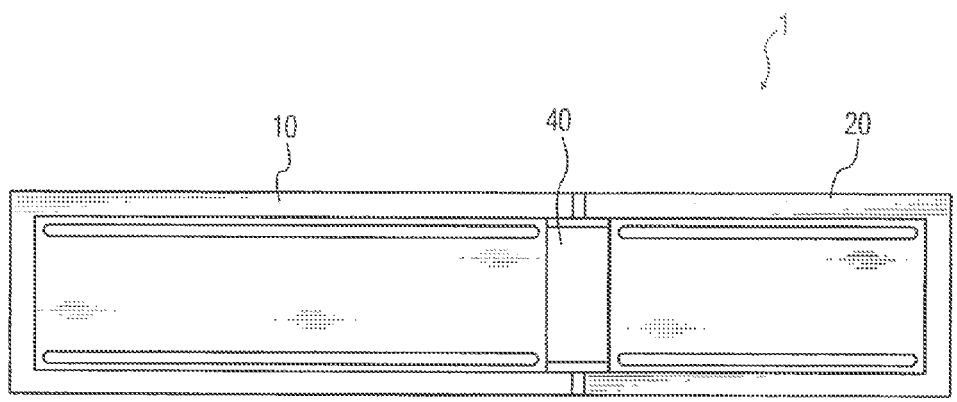
FIG. 5 is a bottom view of the set top box with the storage unit according to the invention.
Figures 6, 7:
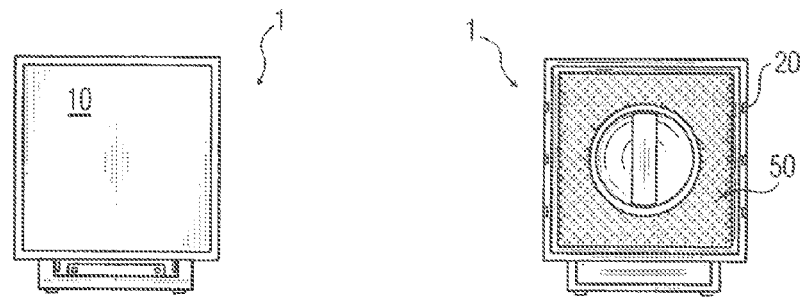
FIG. 6 is a rear view of the set top box with the storage unit according to the invention.
FIG. 7 is a front view of the set top box with the storage unit according to the invention.

The control unit 10 according to the invention is a media gateway and server unit housing a tuner, a processor and a circuit board for decoding the input signal from a signal source (i.e. ethernet cable, satellite dish, coaxial cable, broadband, or even VHF or UHF antennas), and directing two-way communications over an IP network. As shown in FIG. 3, the control unit 10 includes a number of communication and data ports 12 disposed on one side of the control unit and connecting to the computer housed in the control unit 10. The number and types of ports are variable, but may include an Ethernet connection, IEEE 1394 interfaces, serial and parallel ports, HDMI, digital visual interfaces, USB, and coaxial connectors to name a few. Additionally, the control unit 10 includes an AC power assembly, which can include a plug and socket assembly or a direct hard wire connection to an AC plug. The control unit 10 is configured to work independently from the storage unit 20; however, the control unit 10 can connect to the storage unit 20 in order to store media and data into large storage modules that are quickly accessible through the storage unit.

Figure 8:
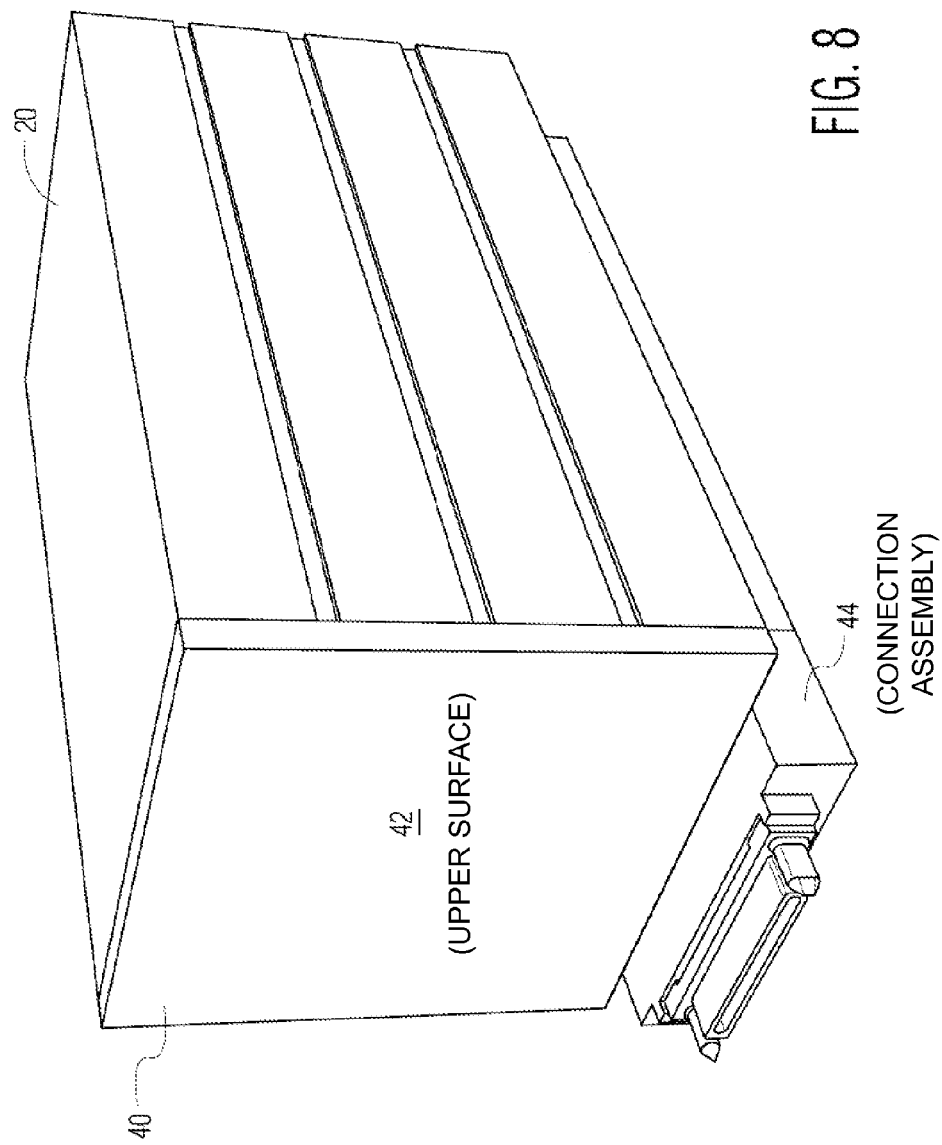
FIG. 8 is a perspective view of a connector connecting with the storage unit according to the invention.
Figure 9:
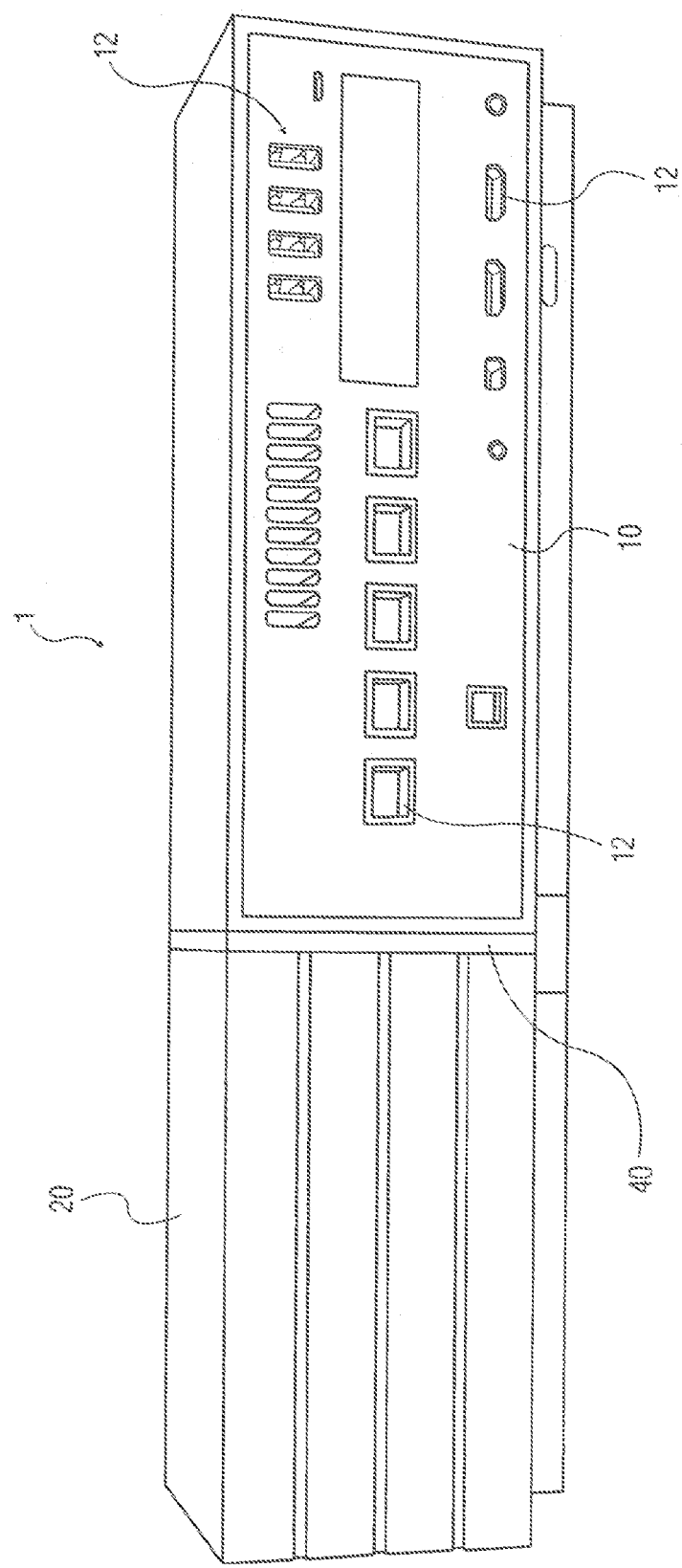
FIG. 9 is a back perspective view of the set top box with the storage unit according to the invention, illustrating exemplary connectivity functions.
Figure 10:
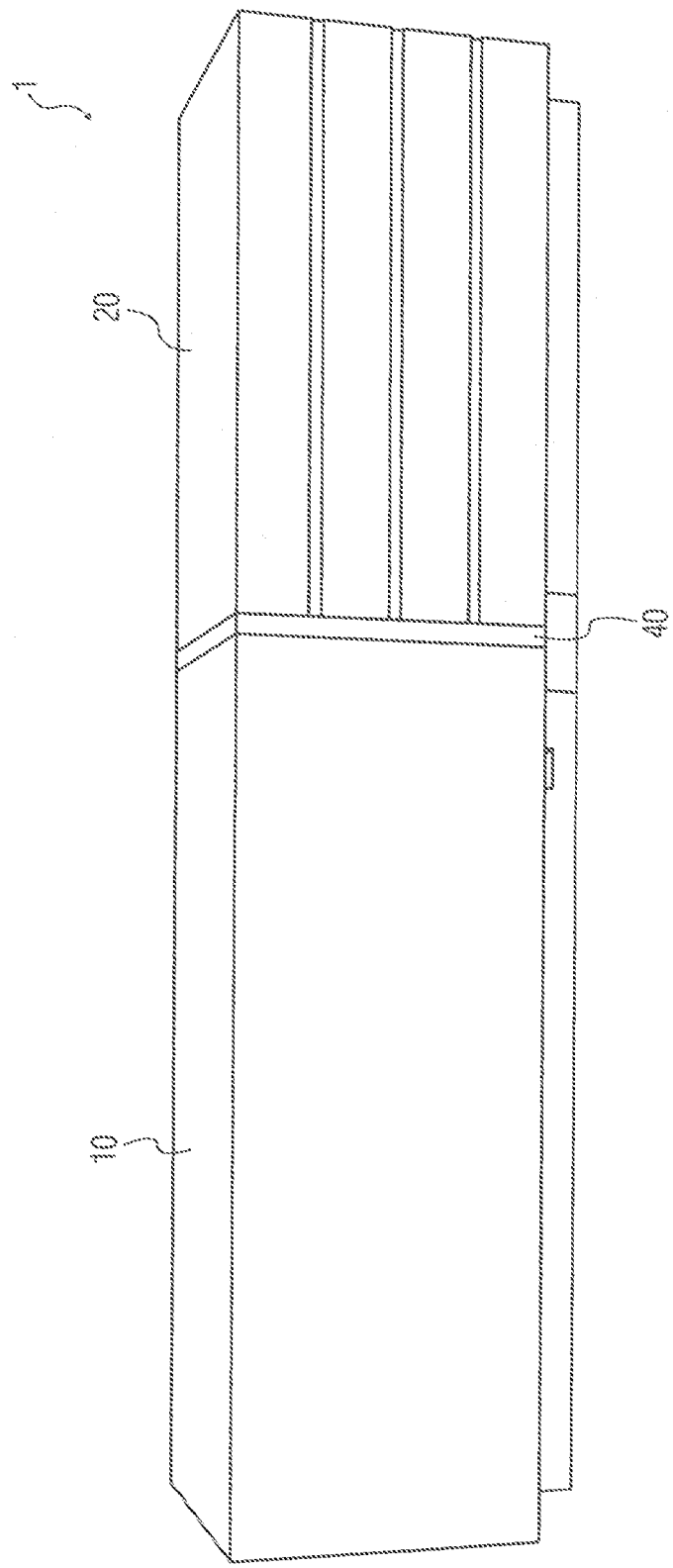
FIG. 10 is a front perspective view of the set top box with the storage unit according to the invention.
Figure 11:
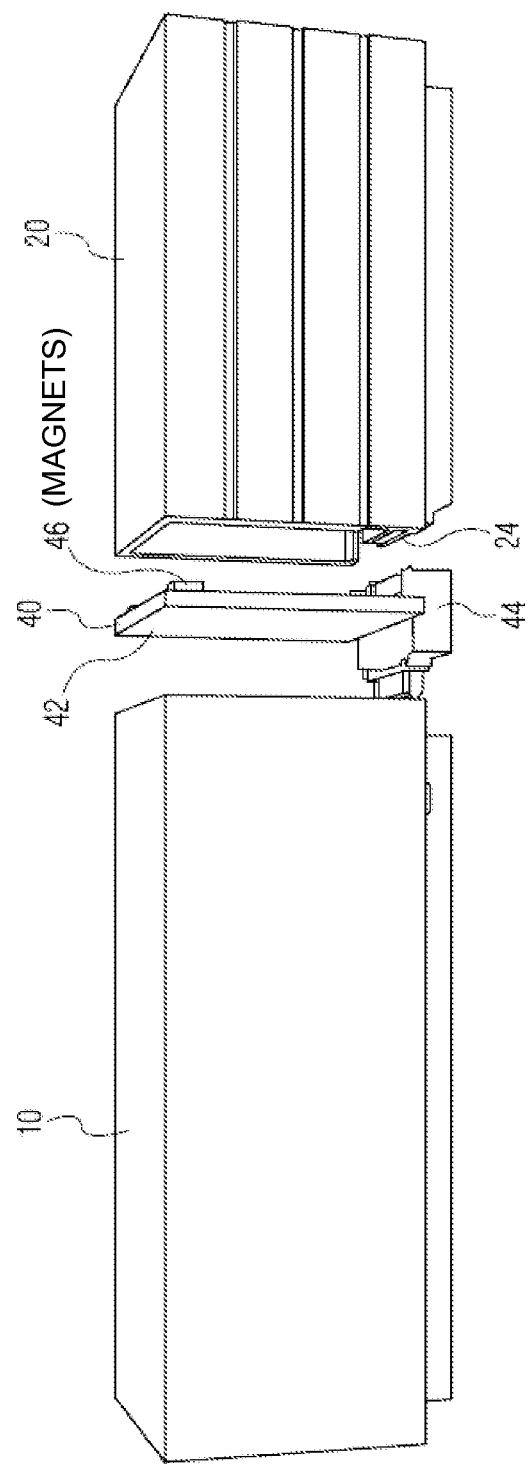
FIG. 11 is partially exploded front perspective view the set top box with the storage unit according to the invention, showing a control unit, the connector, and the storage unit according to the invention separated.

As shown in FIGS. 8 and 11, the connector 40 includes a wall and a connection assembly 44. The connector 40 has a peripheral cross section that is substantially the same as a vertical peripheral cross sections of the control unit 10 and the storage unit, so that when assembled the modular units (i.e. control unit 10, storage unit 20, and connector 40) resemble an integral monolithic structure.

The connector 40 connects the control unit 10 and the storage unit 20, supplying power to the storage unit 20, and enabling communication between the control unit 10 and the storage unit 20 through the connection assembly 44. The connection assembly 44 includes a plug and socket assembly in the embodiment shown, the male plug assembly is positioned on one side of the connection assembly corresponding to a female socket assembly (not shown) in the control unit 10, and the socket is positioned on an opposite side with respect to the plug, and corresponds to a connection assembly 24 (i.e. male plug assembly) in the storage unit 20. The male and female plug assemblies in include power and data ports. In other embodiments, the connection assembly 44 may vary by having additional or different ports. Additionally, the configuration of the connecting plug and socket combinations can vary in kind and positioning between the connector 40, the control unit 10, and the storage unit 20.

In other embodiments, the storage unit 20 and the control unit 10 can connect together without the connector 40, but rather use the connection assemblies described above positioned respectively on the storage unit 20 and the control unit 10.

In the embodiment shown, the storage unit 20 includes a redundant array of independent disks (RAID) storage technology that combines multiple drive components into a single logical unit, where the data are distributed across the multiple drives. Therefore, when control unit 10 and the storage unit 20 are physically connected through the connector 40, a small multi-pin coupler assembly as shown, the control unit 10 can access any of the storage modules within the storage unit top save or retrieve data.

Figure 12:
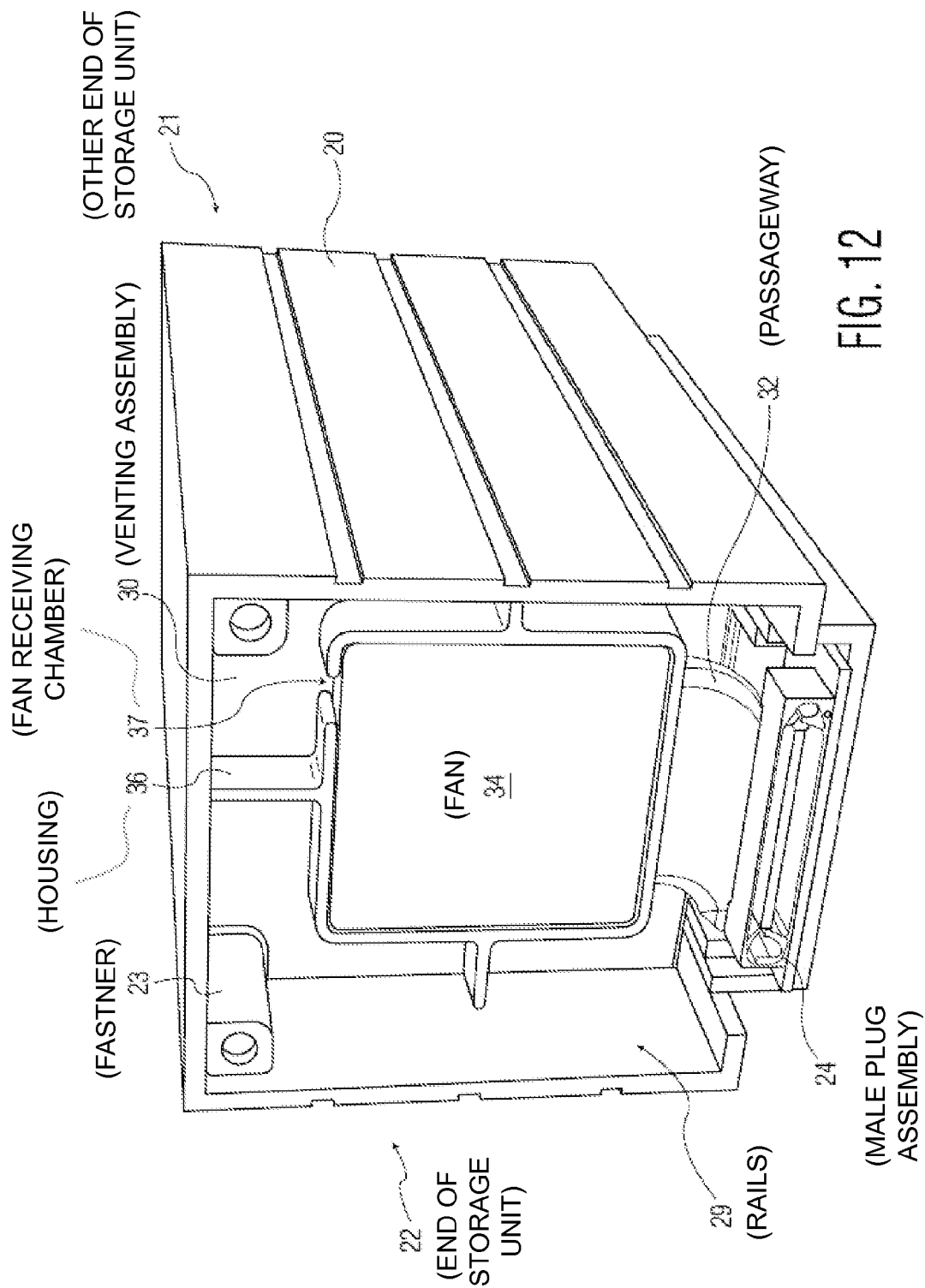
FIG. 12 is a perspective view of a venting assembly of the storage unit according to the invention, showing a fan positioned in the venting assembly.
Figure 13:
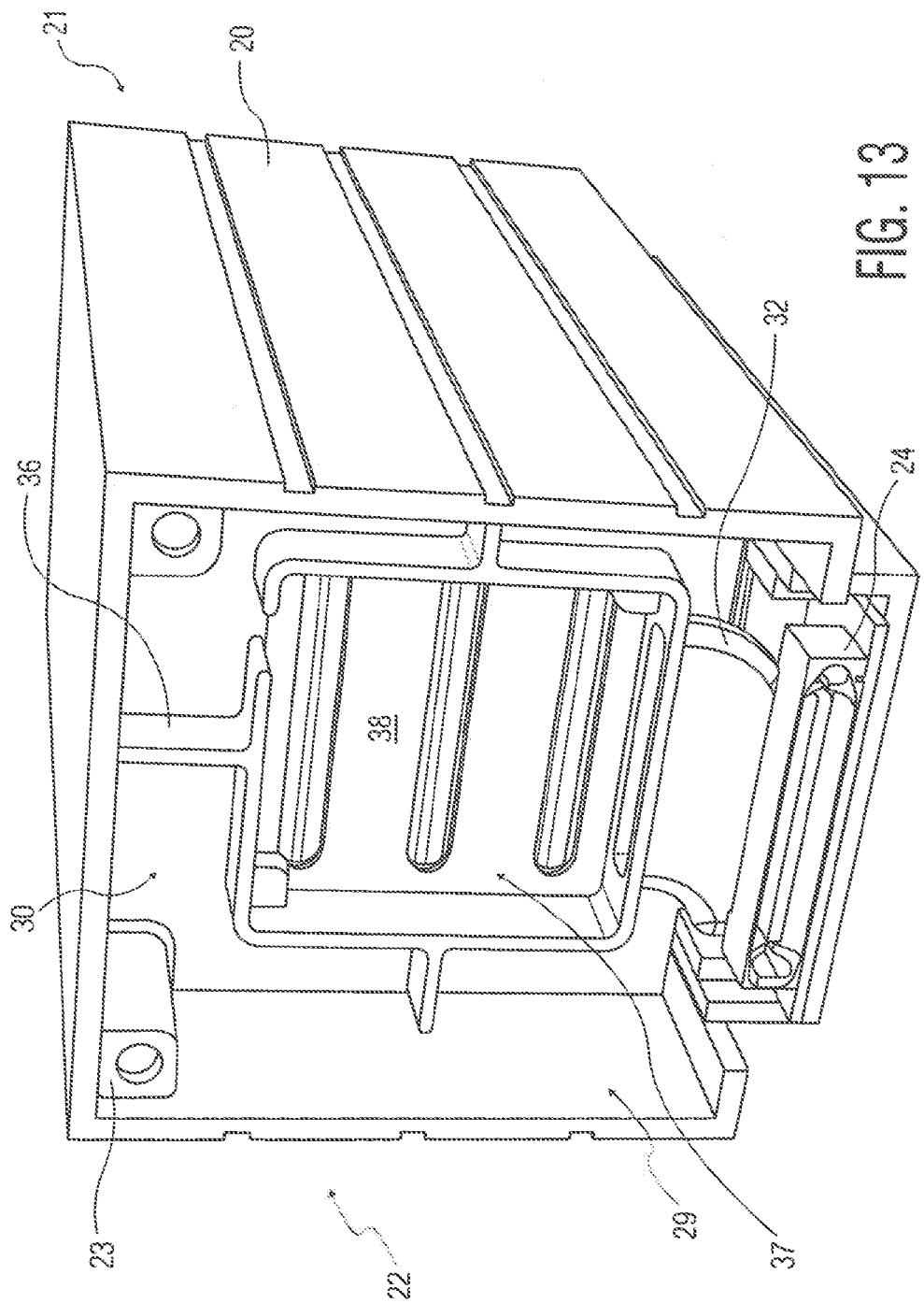
FIG. 13 is a perspective view of the venting assembly of the storage unit according to the invention without the fan.
Figure 14:
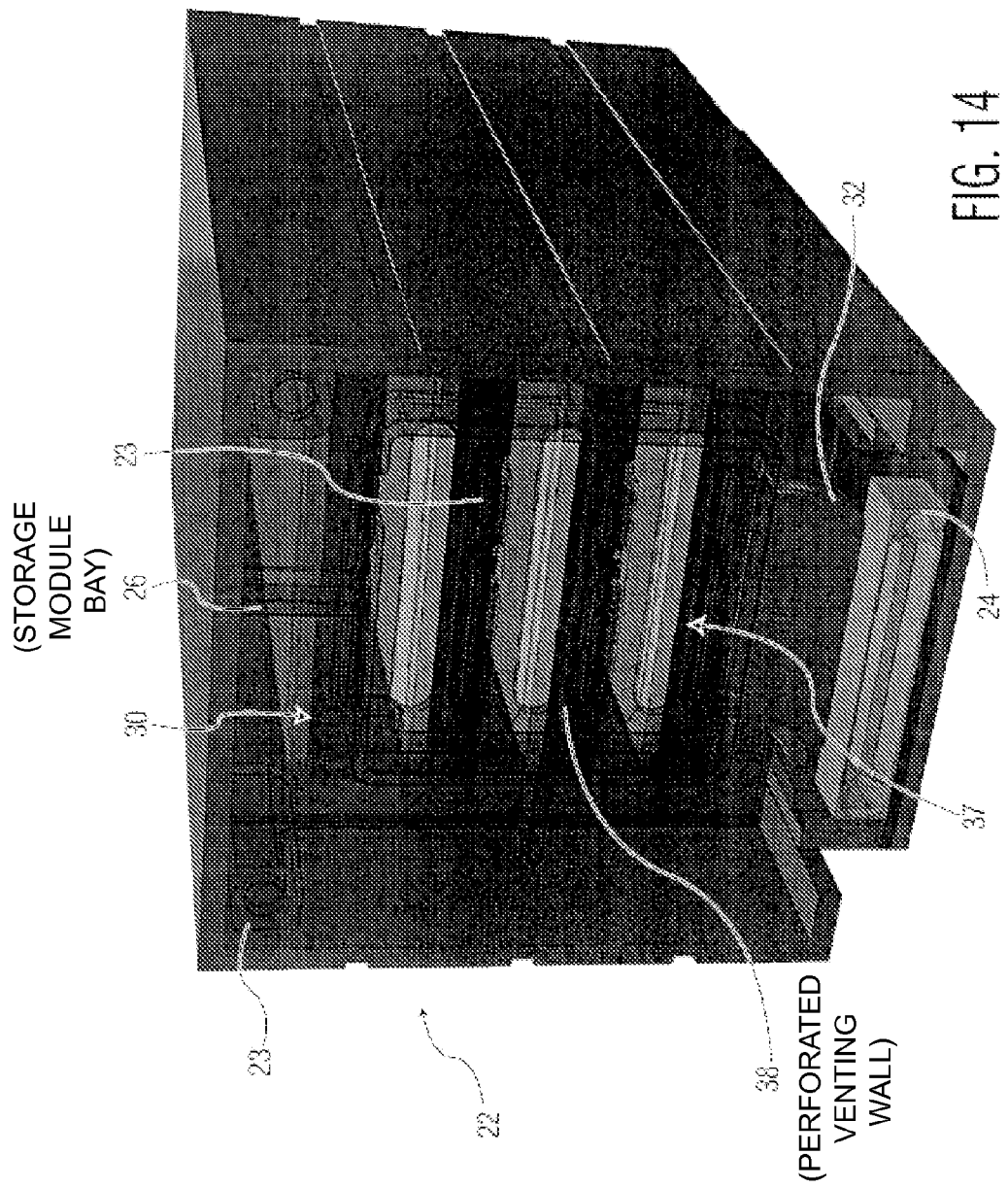
FIG. 14 is another perspective view of the venting assembly of the set top box according to the invention, showing further venting through a perforated wall.
Figure 15:
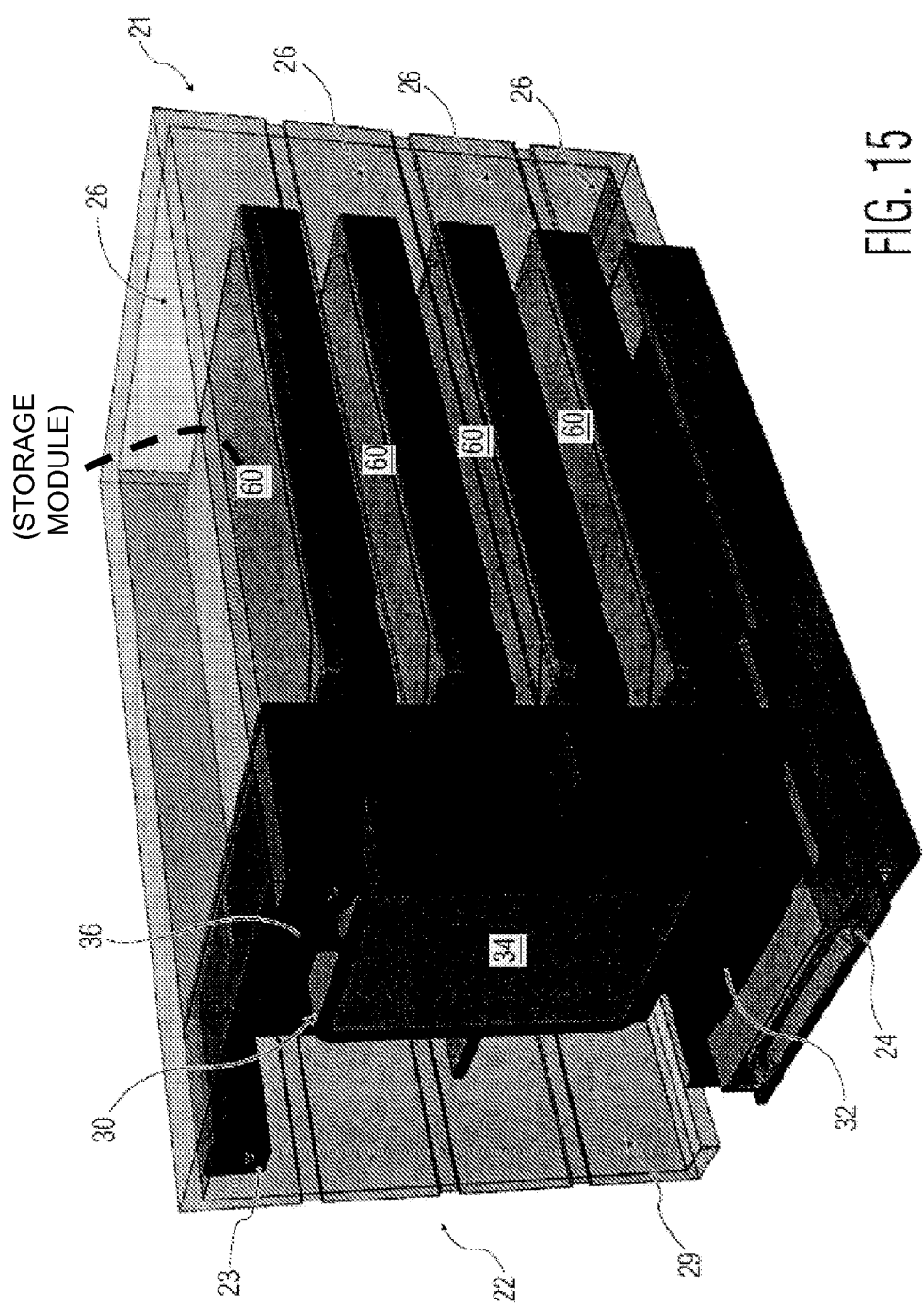
FIG. 15 is a perspective view showing the venting assembly having a fan mounted in the storage unit according to the invention.

In the embodiment shown, the connector 40 includes magnets 46 (illustrated as squares with shallow apertures therein) on an upper side surface 42 to facilitate connection between the control unit 10 and the storage unit 20, which include corresponding magnetic coupling systems (see the fastener 23 in FIG. 12 for example). However, other securing mechanisms known in the art may be implemented.

Turning now to FIGS. 12-21, the storage unit 20 is shown and configured to receive one or multiple storage modules 60, such as HDD or SSD drives. The configuration shown is a "hot swap" configuration; however, other known storage devices and configurations may be used and implemented into the storage unit 20 according to the invention. "Hot swap" can imply connecting and disconnecting without turning off the power.

Figure 16:
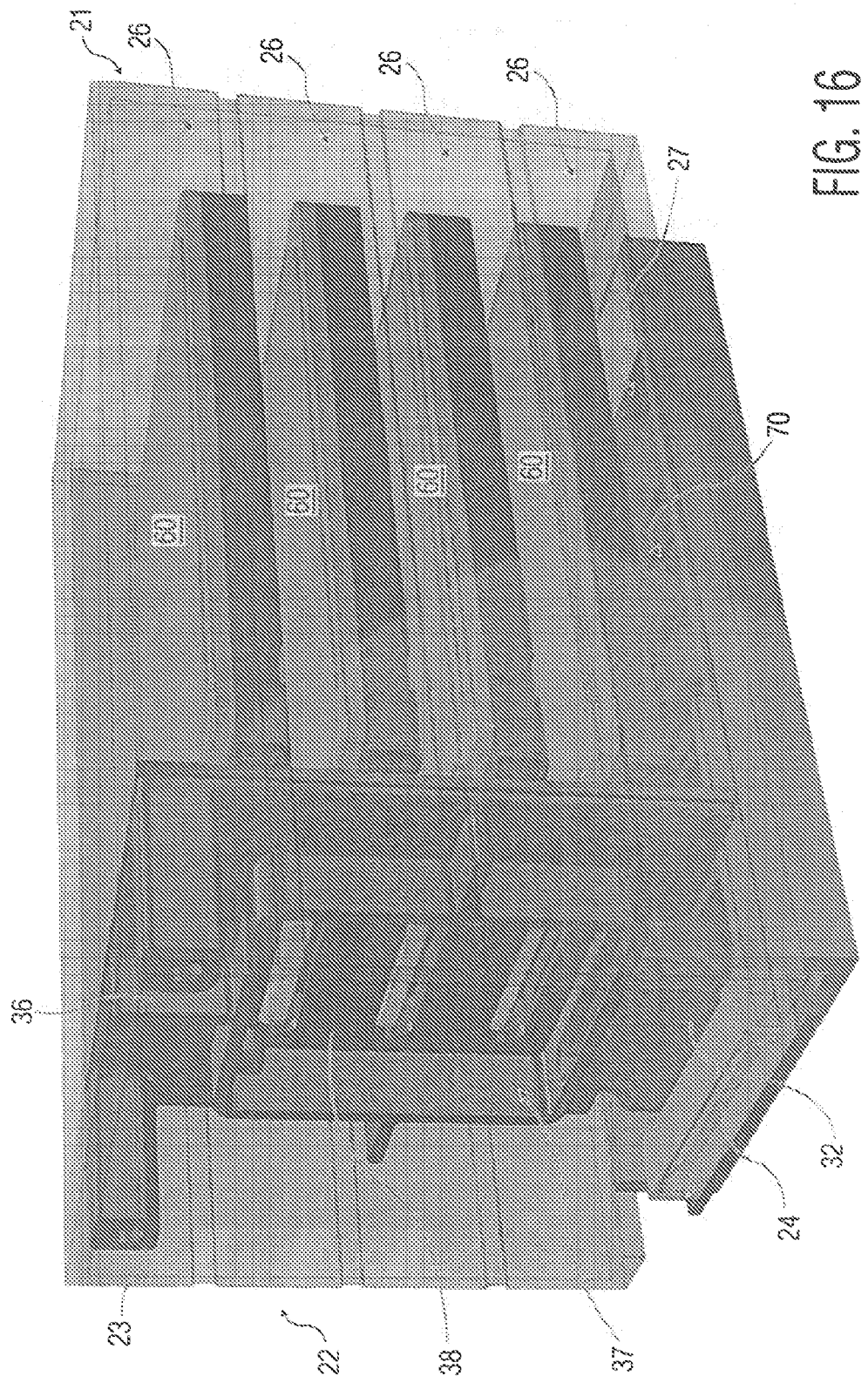
FIG. 16 is another perspective view showing additional venting in storage bays of the storage unit according to the invention.

The associated circuitry 70 for the storage unit 20 is housed in a channel 27 below or adjacent to the storage modules (see, e.g., FIG. 16). The storage modules 60 and circuitry 70 are cooled by a fan 34 in a venting assembly 30, which is situated at one end of this channel 27. The venting assembly 30 is positioned at an end 22 of the storage unit 20 and is seated in a recess of the storage unit 20 housing, since the venting assembly 30. The venting assembly 30 includes a housing 36, a fan receiving chamber 37 positioned between the housing 36, a fan 34 or blower device positioned in the fan receiving chamber 37, a perforated venting wall 38 positioned between the fan and the storage module bays 26, and a vented passageway 32 that leads from the fan receiving chamber 37 and into the channel 27. The perforated venting wall 38 includes a plurality of apertures that correspond with each of the storage module bays 26. The shape and size of the apertures in the perforated venting wall 38 are variable. In the embodiment shown, the apertures are positioned and sized corresponding to each of the storage module bays 26.

Figure 19:
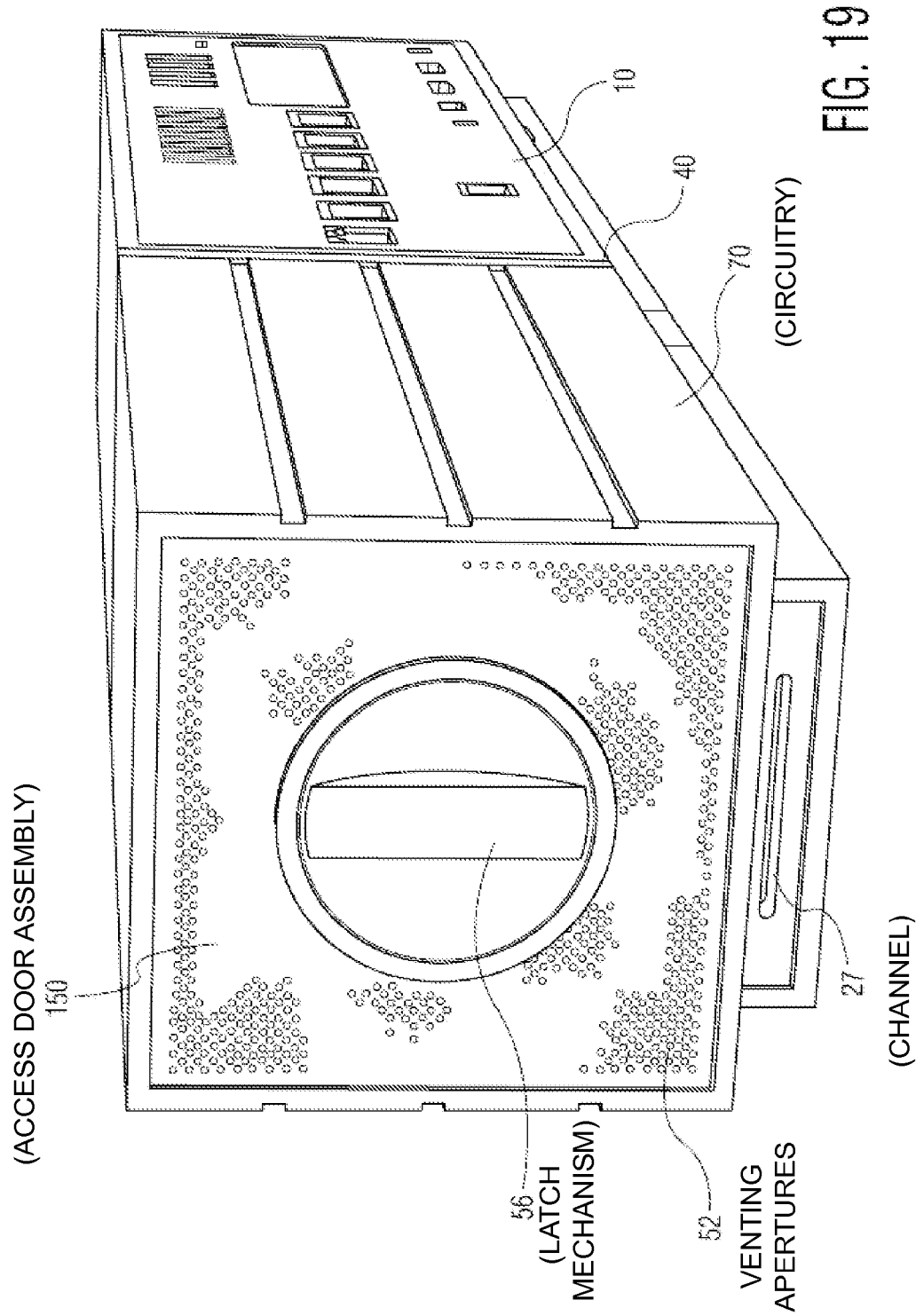
FIG. 19 is a perspective view of access door of the set top box with the storage unit according to the invention.
Figure 20:
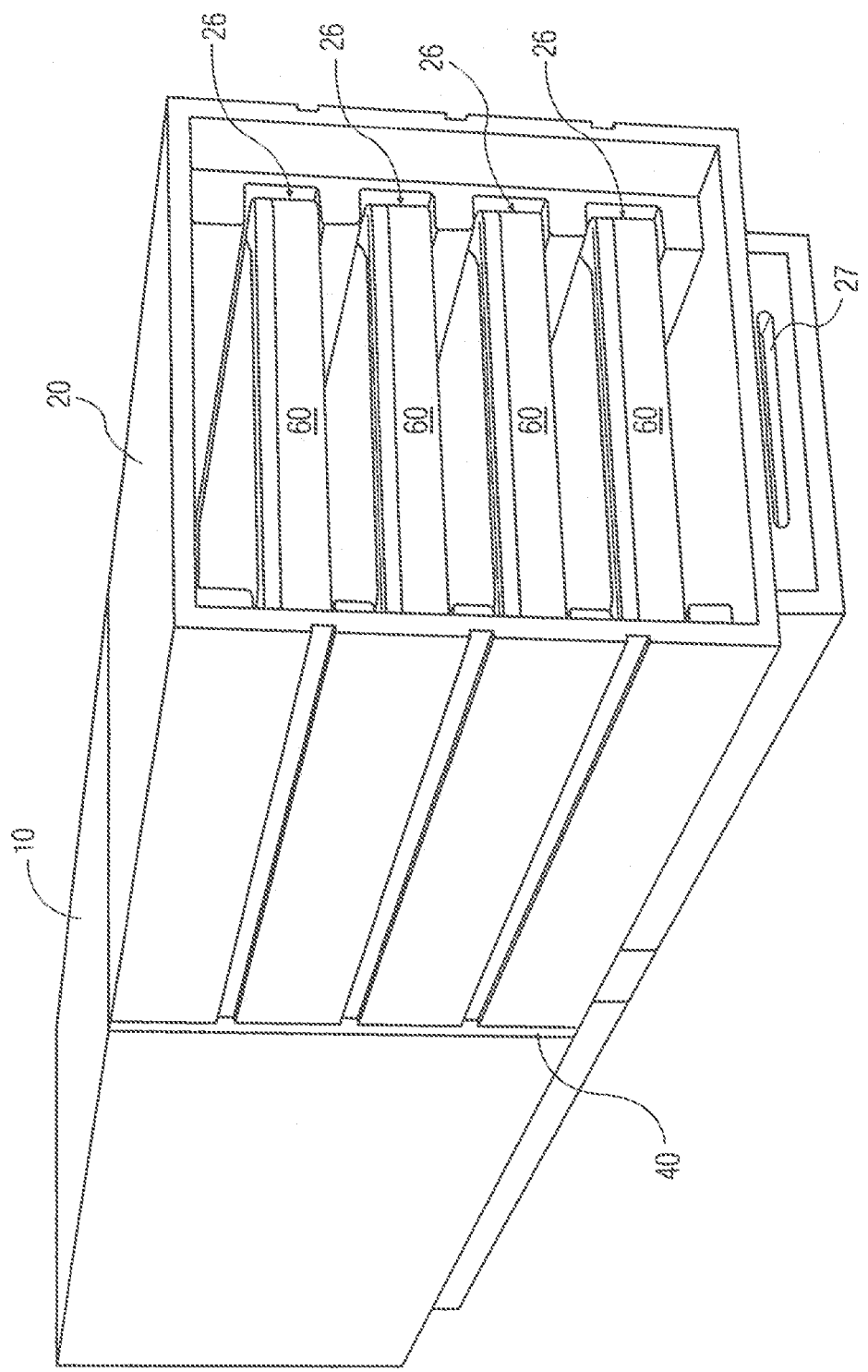
FIG. 20 is a perspective view of the modular storage module assembly of the storage unit according to the invention.

FIG. 19 shows a perspective view of the ventilated access door assembly 150 having the ventilated access door positioned at the other end 21 of the storage unit 20. The door provides access to the storage module bays 26 and storage modules 60. As shown in FIG. 19, the access door 50 includes a plurality of venting apertures 52 that enable effective airflow through the storage unit 20. In the embodiment shown, the access door 50 is a perforated metal sheet that includes a locking mechanism 54 (which will be described in more detail below). Positioned below the access door 50 is an opening to the vented channel 27 that houses the circuitry 70.

Figure 17:
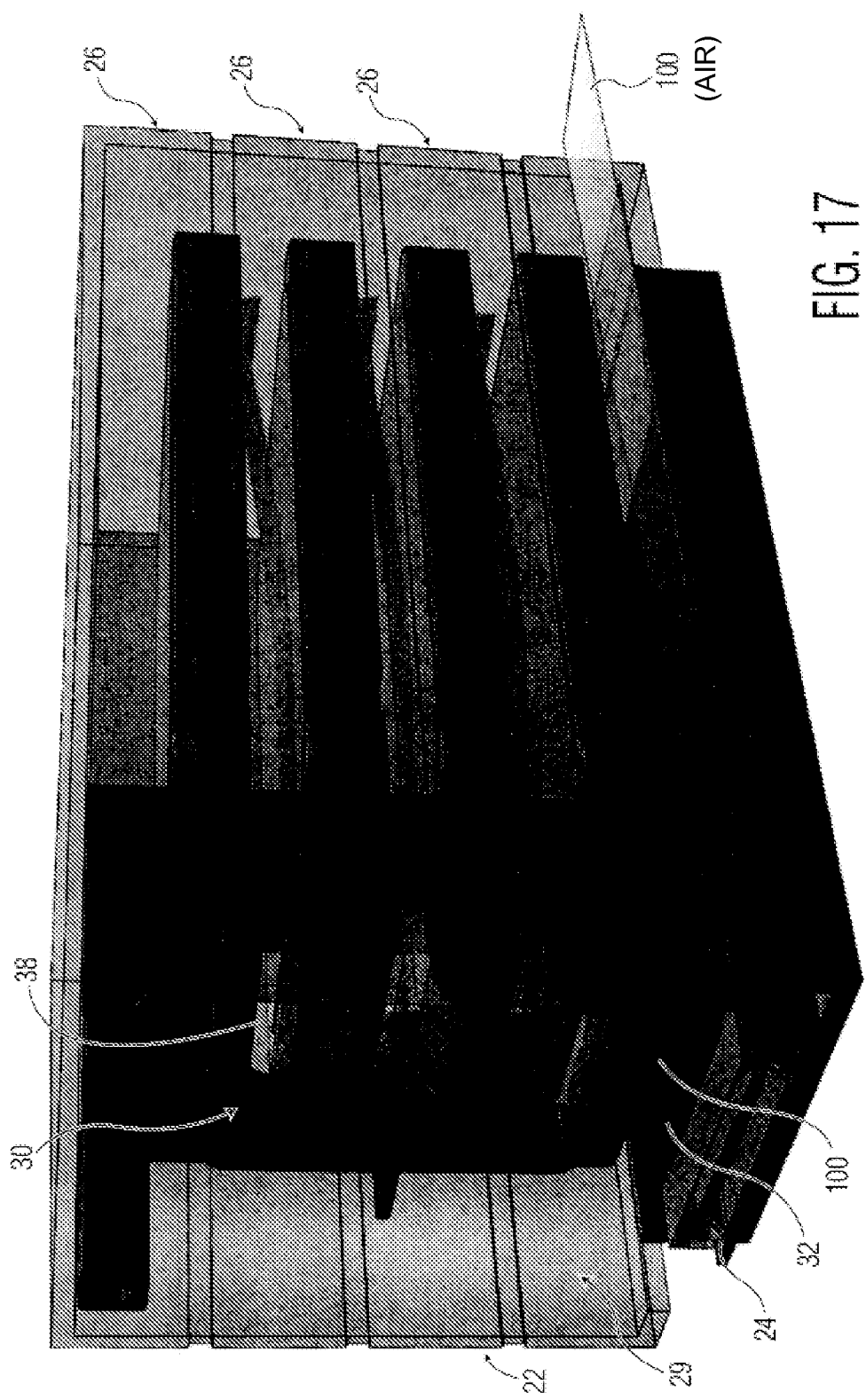
FIG. 17 is a perspective view showing air flow through the storage unit according to the invention.
Figure 18:
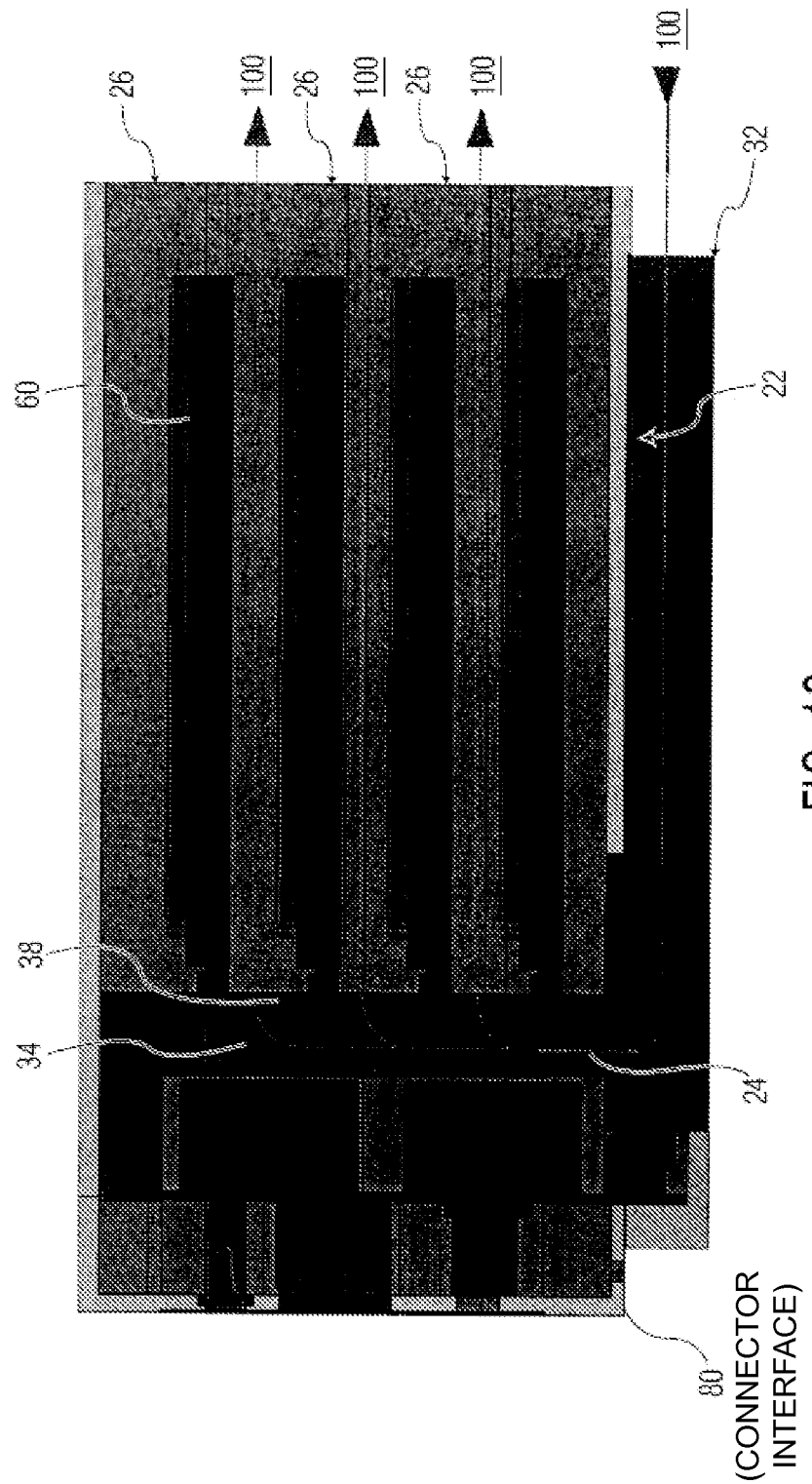
FIG. 18 is a side view showing the air flow through the storage unit according to the invention.

As air 100 is drawn in through the opening of the vented channel 27 and across the circuitry 70 by the fan 34 through the vented passageway 32, the air is then directed through the perforated venting wall 38 and through the storage module bays 26 and across the storage modules 60 (see, e.g., FIGS. 17 and 18). The storage module bays 26 are spaced apart sufficiently that there is ample room between the storage modules 60 to facilitate appropriate airflow (see, e.g., FIG. 20). The entire cooling system is an integral part of the housing, which makes up the enclosure of the storage unit 20.

Figure 21:
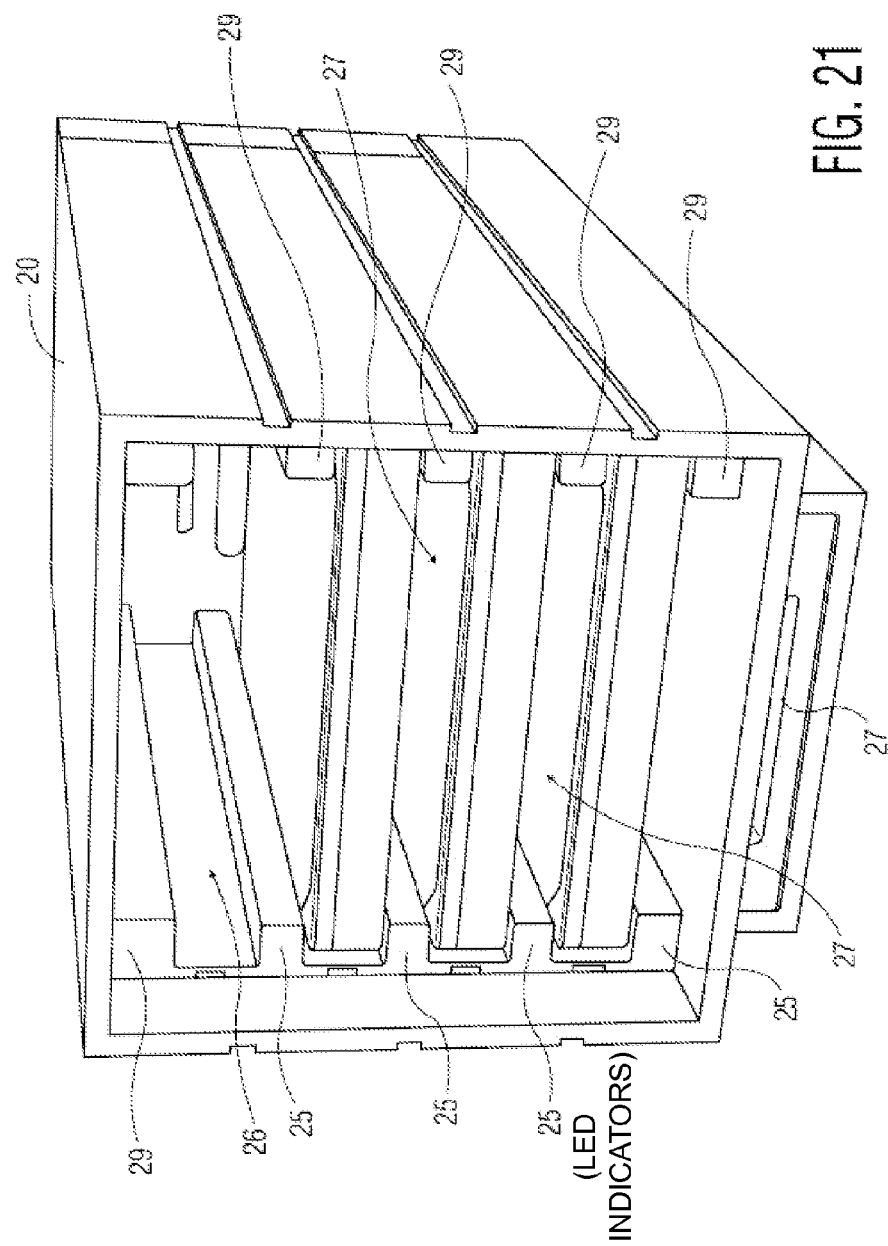
FIG. 21 is a perspective view of the storage unit showing removal of a storage module within one of the plurality of storage ports
Figure 22A:
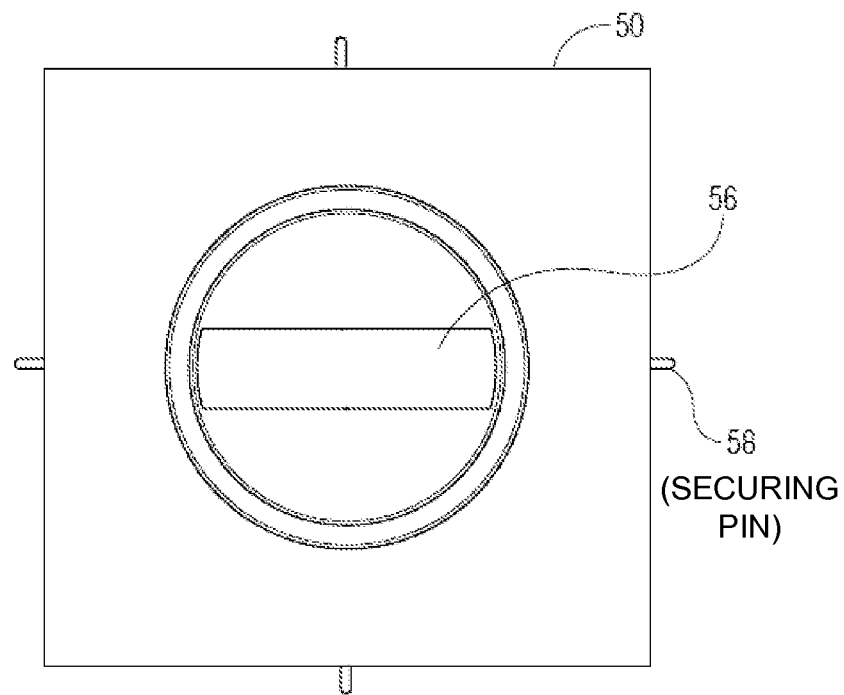
FIG. 22A is a front view of the access door with a magnetic locking assembly in a locked position.
Figure 22B:
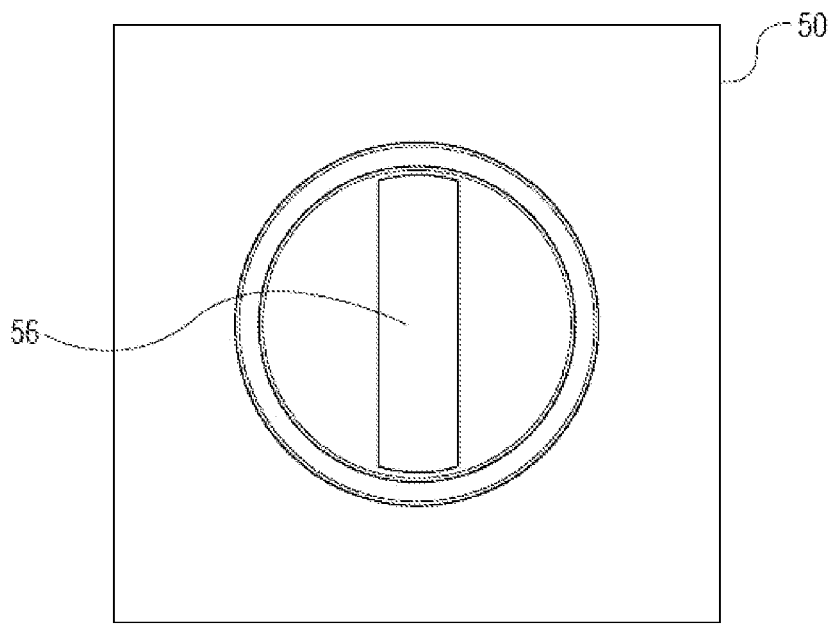
FIG. 22B is a front view of the access door with a magnetic locking assembly in an unlocked position.
Figure 22C:
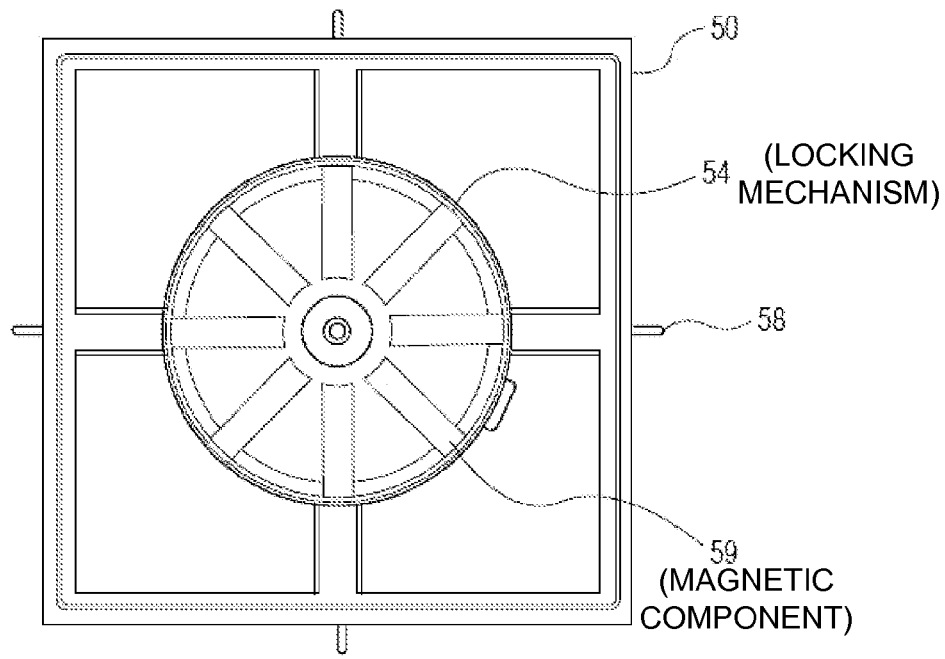
FIG. 22C is a rear view of the access door with the magnetic locking assembly in the locked position.
Figure 22D:
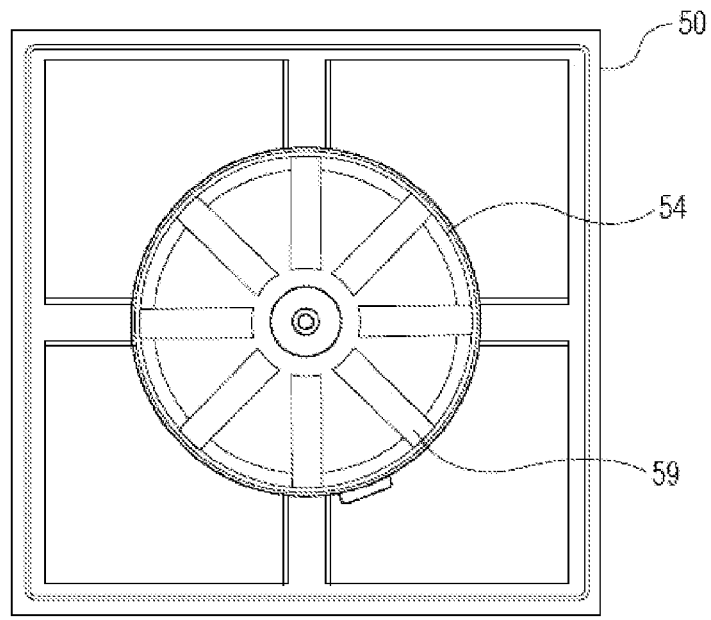
FIG. 22D is a front view of the access door with a magnetic locking assembly in the unlocked position.

As discussed, the access door 50 on the storage unit 20 is perforated or otherwise ventilated. However, the access door 50 also provides security for the electronic circuitry and the storage modules 60. As shown in FIG. 21, each of the storage module 60 are accessible from their respective storage module bays 26, and in the embodiment shown, each storage module 60 is removable. As shown in FIG. 21, the storage unit 20 may also contain extruded rails 29 that separate and hold the storage modules 60 in the storage module bays 26. The storage modules 60 are connected to the circuitry 70, notably through a circuit board at one end of these rails 29 (see FIGS. 25 and 26). The storage unit 20 also includes LED indicators 25 to signal the status of each individual drive connection between the storage module 60 and the circuitry 70, including the PCB. These LED indicators 25 would normally be concealed, yet an optical light-pipe is incorporated into each drive rail, transferring the LED illumination to the front or open end of the enclosure to provide a visual indicator near each storage module 60.

Figure 24:
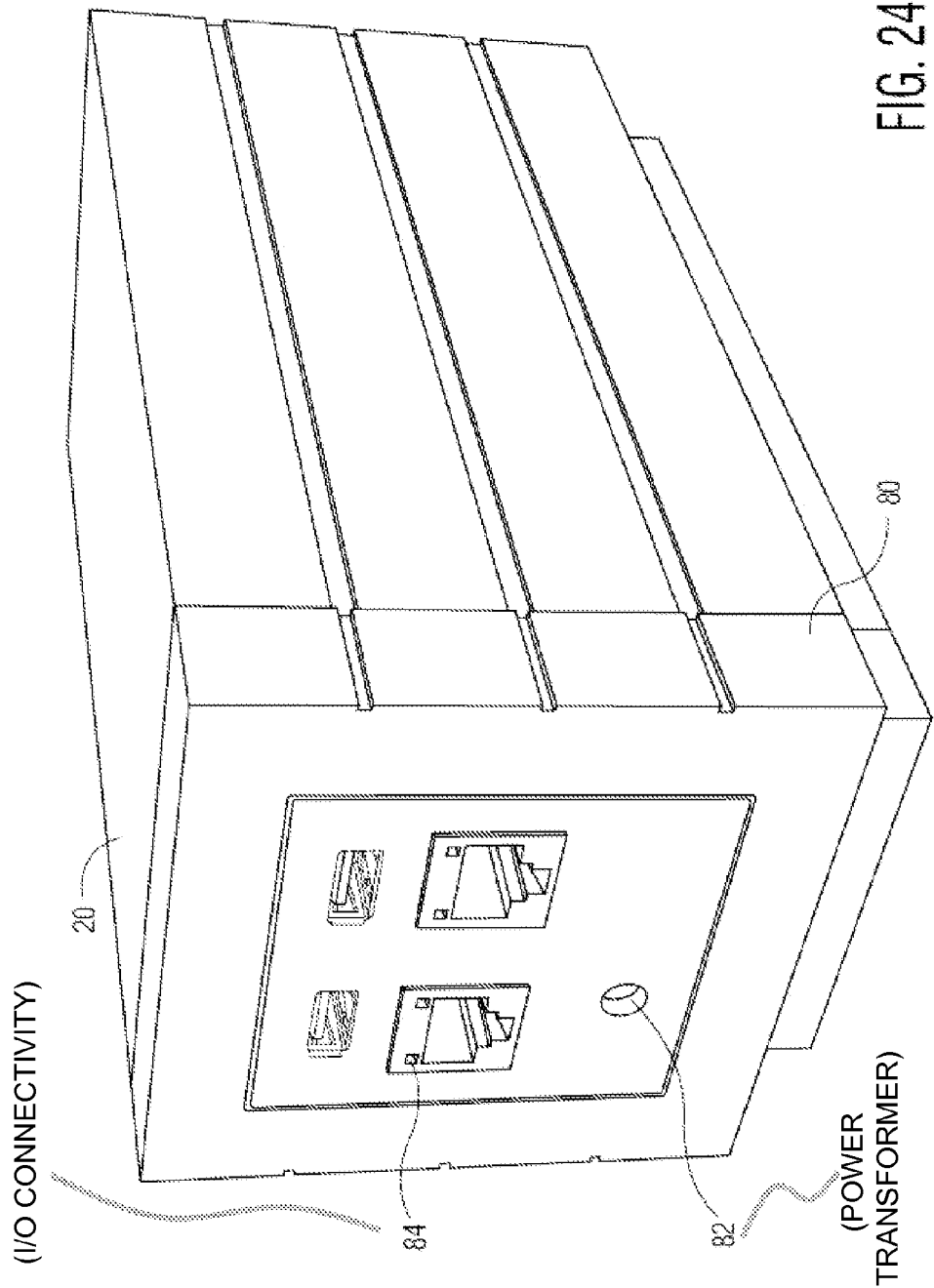
FIG. 24 is a front perspective view of a connector interface and the storage unit according to the invention.

Now, with reference to FIGS. 22-24, the access door 50 will be discussed. The venting apertures 52 have been removed for clarity in the description of the mechanical components of the access door 50. The access door 50 is secured by a rotating latch mechanism 56 that locks or unlocks the locking mechanism 54 located in the access door.

The access door 50 according to the invention includes securing pins 58 that are disposed in the access door 50 and protrude from side walls of the access door 50 when the latch mechanism 56 is rotated, which activates the locking mechanism 54 (see FIGS. 22A through 22D). The locking mechanism 54 actuates the securing pins 58 by a series of magnetic components 59 in the locking mechanism 54 that attract or repel the securing pins 58 depending on the rotational position of the latch mechanism 56. As shown in FIG. 23, access door 40 includes a plurality of pin receiving passageways 55 for receiving the securing pin 58. A stop (not shown) can also be included in the pin receiving passageways 55 to limit the extent to which the securing pins 58 can extend into or out of the pin receiving passageway 55. The storage unit 20 includes a plurality of locking apertures on at least two walls of the storage unit 20 that are each aligned with the plurality of pin receiving passageways 55 in the access door 50 such that when the elongated magnetic components 59 move the securing pins 58, the securing pins 58 are received into the locking apertures, thereby securing the access door 50 with the storage unit 20.

Figure 25:
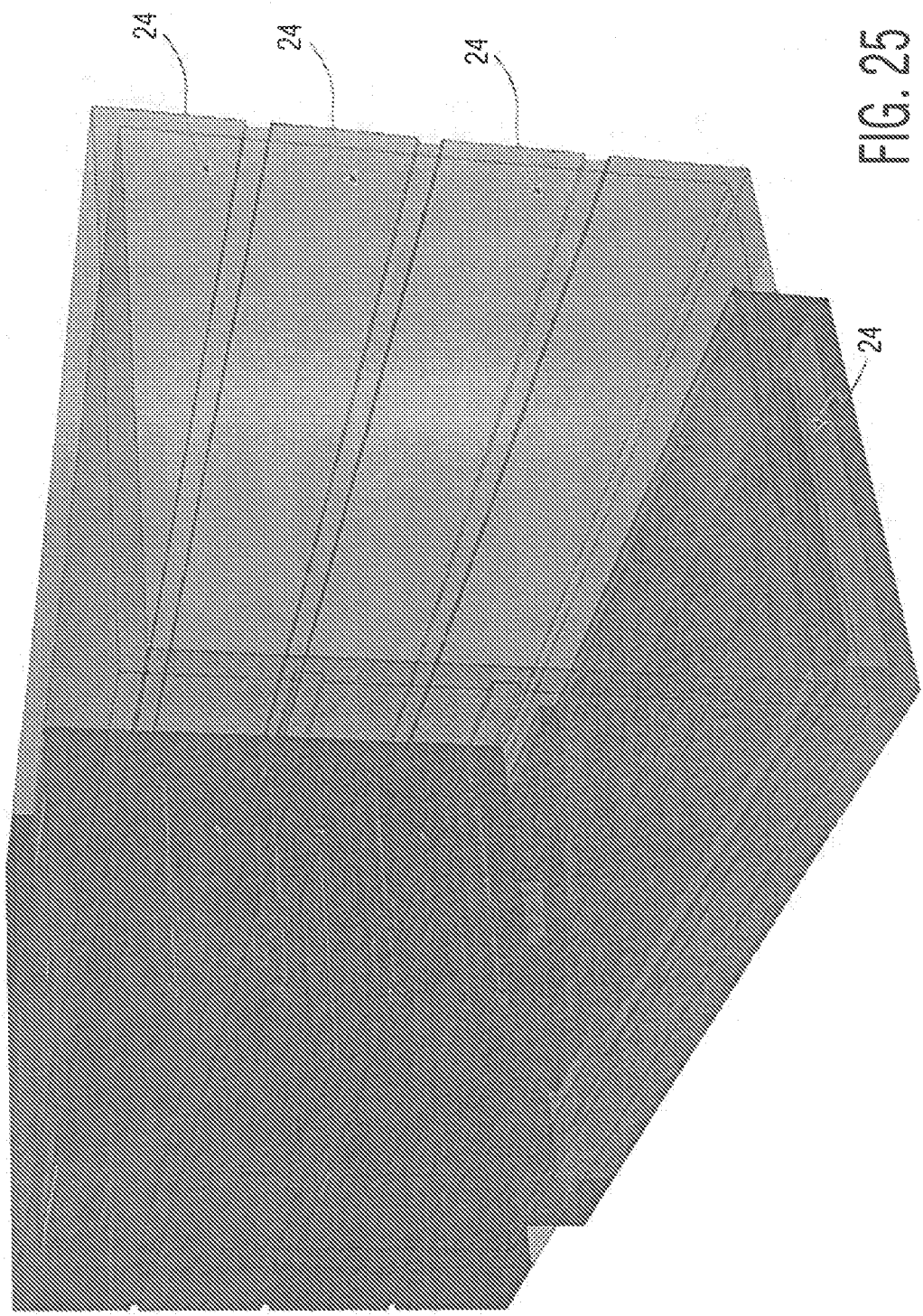
FIG. 25 is a rear perspective view of the connector interface and the storage unit according to the invention.

Now with reference to FIGS. 24-26, the storage unit 20 will be discussed as a separate stand-alone unit. The storage unit 20 according to the invention derives its power from, and is interconnected to the control unit 10 through the connector 40 in the embodiment shown. If separated and in stand-alone mode as, for example, as clearly shown in FIG. 24, the storage unit 20 receives a small end cap as a connector interface 80 that provides I/O connectivity 84 and power transformer capabilities 82. This connector interface 80 is coupled to the storage unit 20 in the same manner as the connector 40, so the connection assembly will be omitted for purposes of brevity. Other attachments and ports can be available.

The set top box 1 according to the invention can have an enclosure or housing made from a textured, semi-translucent material. An OLED status display can be housed within the enclosure in such a way as to completely conceal the display when in standby mode. The background tone of the display is similar to that of the enclosure material. When viewed through the textured enclosure, this screen/housing combo creates the effect of a floating display. Additionally, the set top box 1 contains capacitive proximity sensors to allow the user to control the functions of the set top box 1 simply by touching the exterior of the product near indicated areas near the display. The overall effect allows for the enclosure or housing to appear as a blank, monolithic material when in standby, yet with active display and inputs when activated.

It should be understood that the elements shown in the figures can be implemented in various forms of hardware, software or combinations thereof. Preferably, these elements are implemented in a combination of hardware and software on one or more appropriately programmed general-purpose devices, which can include a processor, memory and input/output interfaces.

The present description illustrates the principles of the disclosure. It will thus be appreciated that those skilled in the art will be able to devise various arrangements that, although not explicitly described or shown herein, embody the principles of the disclosure and are included within its spirit and scope.

All examples and conditional language recited herein are intended for informational purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herewith represent conceptual views of illustrative circuitry embodying the principles of the disclosure. Similarly, it will be appreciated that any flow charts, flow diagrams, state transition diagrams, pseudocode, and the like represent various processes which may be substantially represented in computer readable media and so executed by a computer or processor, whether or not such computer or processor is explicitly shown.

The functions of the various elements shown in the figures can be provided through the use of dedicated hardware as well as hardware capable of executing software in association with appropriate software. When provided by a processor, the functions can be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Although embodiments which incorporate the teachings of the present disclosure have been shown and described in detail herein, those skilled in the art can readily devise many other varied embodiments that still incorporate these teachings. Having described preferred embodiments for a set top box 1 having media gateway, server and storage units (which are intended to be illustrative and not limiting), it is noted that modifications and variations can be made by persons skilled in the art in light of the above teachings.

The invention claimed is:

1. A electronic system, comprising:
a set top box (STB);
a storage unit having a housing and a plurality of storage bays for receiving storage modules having two parallel broad sides;
a connector securing the STB and the storage unit together and positioned there between, the connector having a vertical peripheral cross section being substantially the same as a vertical peripheral cross section of the STB and the storage unit; an access door disposed along a first end of the storage unit; and a locking mechanism on the access door that includes a plurality of elongated magnetic components extending from a central region of the locking mechanism and corresponding with a plurality of securing pins, wherein the elongated magnetic components push the plurality of securing pins outward from the access door into pin receiving passageways to secure the access door.

2. The electronic system according to claim 1, wherein the plurality of storage bays are parallel to one another with air gaps there between when the storage modules are positioned in each of the plurality of storage bays.

3. The electronic system according to claim 2, wherein the storage unit is configured to draw air in a first unilateral direction through a vented channel positioned along the first end of the storage unit and then direct the air through the plurality of storage bays in a second unilateral direction using a venting assembly positioned along a second end of the storage unit.

4. The electronic system of claim 3, wherein the venting assembly includes a venting passageway leading from the vented channel to a fan receiving chamber for holding a blower that directs the air into storage bays.

5. The electronic system of claim 4, further comprising a perforated wall positioned between the venting assembly and the plurality of storage bays, the perforated wall having a plurality of vents corresponding to each of the plurality of storage bays.

6. The electronic system of claim 3, wherein the a locking mechanism is activated by a latch, and the plurality of securing pins extend beyond surface ends of the access door to secure the access door to the storage unit.

7. The electronic system of claim 6, wherein the plurality of elongated magnetic components and the plurality of securing pins extend along a common plane.

8. The electronic system of claim 6, wherein the elongated magnetic components turn by motion of the latch and retract the plurality of securing pins when the elongated magnetic components align parallel with the plurality of pin receiving passageways of the access door.

9. The electronic system of claim 8, further comprising a plurality of locking apertures disposed on at least two walls of the storage unit, each locking aperture being aligned with the plurality of pin receiving passageways such that the plurality of securing pins are received into the plurality of locking apertures when the elongated magnetic components are positioned to move the plurality of securing pins, thereby securing the access door with the storage unit.

10. The electronic system of claim 6, wherein the access door has a perforated surface of venting apertures.

11. A storage unit for set top box unit, the storage unit comprising:
A housing; A connector secured to the set top box and the storage unit together and positioned there between;

a plurality of storage bays for receiving and holding storage modules having two parallel broad sides, the plurality of storage bays are positioned parallel to one another to provide air gaps there between when the storage modules are positioned in each of the plurality of storage bays;

an end cap positioned at one end of the housing for providing I/O connectivity and power transformer capability; an access door disposed along the end of the storage unit; a latch; a plurality of securing pins that extend beyond surface ends of the access door and configured; a locking mechanism activated by the latch, the locking mechanism including a plurality of elongated magnetic components extending from a central region of the locking mechanism and corresponding with the plurality of securing pins, the elongated magnetic components pushing the plurality of securing pins outward to secure the access door with the storage unit.

12. The storage unit according to claim 11, wherein the storage unit is configure to draw air in a first unilateral direction from another end of the housing through a vented channel positioned and direct through the plurality of storage bays by a venting assembly positioned between the end cap and storage bays.

13. The storage unit of claim 12, wherein the venting assembly includes a venting passageway leading from the vented channel to a fan receiving chamber containing a blower that directs the air into storage bays.

14. The storage unit of claim 13, further comprising a perforated wall positioned between the venting assembly and the plurality of storage bays, the perforated wall having a plurality of vents corresponding to each of the plurality of storage bays.

15. The storage unit of claim 11, wherein the plurality of elongated magnetic components and the plurality of securing pins extend along a common plane.

16. The storage unit of claim 15, further comprising a plurality of pin receiving passageways disposed in the access door and receiving the plurality of securing pins.

17. The storage unit of claim 16, wherein the elongated magnetic components turn by motion of the latch and retract the plurality of securing pins when the elongated magnetic components align parallel with the plurality of pin receiving passageways.

18. The storage unit of claim 17, further comprising a plurality of locking apertures disposed on at least two walls of the storage unit, each locking aperture aligned with the plurality of pin receiving passageways such that the plurality of securing pins are received into the plurality of locking apertures when the elongated magnetic components are positioned to move the plurality of securing pins, thereby securing the access door with the storage unit.

19. The storage unit of claim 18, wherein the elongated magnetic components turn by motion of the latch and push the plurality of securing pins outward from the access door when the elongated magnetic components align parallel with the plurality of pin receiving passageways.

20. The storage unit of claim 17, further comprising a plurality of locking apertures disposed on at least two walls of the storage unit, each locking aperture aligned with the plurality of pin receiving passageways such that the plurality of securing pins are received into the plurality of locking apertures when the elongated magnetic components are positioned to move the plurality of securing pins, thereby securing the access door with the storage unit.

* * * * *